(12) United States Patent
Suzuki et al.

(10) Patent No.: US 6,937,485 B2
(45) Date of Patent: Aug. 30, 2005

(54) DUTY RATIO DETECTING APPARATUS WITH SMALL RETURN TIME

(75) Inventors: Misao Suzuki, Tokyo (JP); Kazutaka Miyano, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/650,542

(22) Filed: Aug. 28, 2003

(65) Prior Publication Data

US 2004/0070435 A1 Apr. 15, 2004

(30) Foreign Application Priority Data

Aug. 29, 2002 (JP) ........................................ 2002-249945

(51) Int. Cl.$^7$ ............................. H02M 1/14; H02M 1/12
(52) U.S. Cl. ........................... 363/41; 327/175; 327/425
(58) Field of Search ............................ 363/41; 327/175, 327/425

(56) References Cited

U.S. PATENT DOCUMENTS

| | | | | |
|---|---|---|---|---|
| 4,881,041 A | * | 11/1989 | Kawanabe et al. | ......... 327/167 |
| 5,047,988 A | * | 9/1991 | Mizuta | ........................ 365/229 |
| 5,057,702 A | * | 10/1991 | Kitagawa et al. | ........... 327/175 |
| 6,147,536 A | * | 11/2000 | Jeong | .......................... 327/283 |
| 6,198,322 B1 | * | 3/2001 | Yoshimura | ................... 327/175 |
| 6,577,167 B1 | * | 6/2003 | Soda | ............................ 327/91 |
| 6,624,676 B2 | * | 9/2003 | Daio | ............................ 327/175 |

FOREIGN PATENT DOCUMENTS

JP     2002-135105     5/2002     ....... H03K/19/0175

* cited by examiner

*Primary Examiner*—Bao Q. Vu
(74) *Attorney, Agent, or Firm*—Hayes Soloway P.C.

(57) ABSTRACT

In a duty ratio detecting apparatus, a duty ratio detecting circuit is constructed by first and second nodes, a load current supplying circuit for supplying first and second load currents to the first and second nodes, respectively, and a current switch connected to the first and second nodes. The current switch is operated in response to first and second complementary duty ratio signals. A duty ratio maintaining circuit is constructed by third and fourth nodes for receiving and maintaining voltages at the first and second nodes, respectively. A first switch is connected between the first and third nodes, and a second switch is connected between the second and fourth nodes. The load current supplying circuit is controlled by voltages at the third and fourth nodes.

8 Claims, 8 Drawing Sheets

DUTY RATIO DETECTING APPARATUS WITH SMALL RETURN TIME

DESCRIPTION OF THE INVENTION

1. Field of the Invention

The present invention relates to a duty ratio correcting apparatus, and more particularly, to a duty ratio detecting apparatus thereof.

2. Description of the Related Art

Recently, in order to enhance read operation speed, double data rate (DDR)-type dynamic random access memory (DRAM) devices have been developed.

In a DDR-type DRAM device, the read operation is carried out in accordance with both of a rising edge and a falling edge of an external clock signal. Therefore, when the external clock signal is converted into an internal clock signal whose duty ratio is a predetermined value for a read operation mode, a duty ratio correcting apparatus is required.

A prior art duty ratio correcting apparatus is constructed by a duty ratio adjusting circuit for receiving an external clock signal to generate an internal clock signal, a differentializing circuit for differentializing the internal clock signal to generate first and second complementary duty ratio signals, a duty ratio detecting circuit for detecting first and second duty ratios of the first and second complementary duty ratio signals, and a duty ratio maintaining circuit for the first and second duty ratios, so that the duty ratio adjusting circuit adjusts the duty ratio of the external clock signal in accordance with the maintained first and second duty ratios. On the other hand, in order to reduce the power consumption in a stand-by mode, the duty ratio adjusting circuit and the differentializing circuit are deactivated, and at the same time, the duty ratio maintaining circuit is electrically isolated from the duty ratio detecting circuit by a switch circuit inserted therebetween.

Also, the duty ratio detecting circuit is constructed by first and second nodes, a load current supplying circuit for supplying first and second load currents to the first and second nodes, respectively, and a current switch connected to the first and second nodes. The current switch is operated in response to first and second complementary duty ratio signals. The load current supplying circuit is controlled by voltages at the first and second nodes. This will be explained later in detail.

In the above-described prior art duty ratio correcting apparatus, however, since the load current supplying circuit is controlled by the voltages at the first and second nodes so that the operation of the load current supplying circuit is insufficient, a reverse adjusting operation of the duty ratio adjusting circuit may be carried out whereby a return time becomes a relatively large, so that the duty ratio correcting apparatus cannot be guaranteed.

SUMMARY OF THE INVENTION

It is an object of the present invention to provide a duty ratio detecting apparatus capable of guaranteeing the operation of the duty ratio correcting apparatus.

According to the present invention, in a duty ratio detecting apparatus, a duty ratio detecting circuit is constructed by first and second nodes, a load current supplying circuit for supplying first and second load currents to the first and second nodes, respectively, and a current switch connected to the first and second nodes. The current switch is operated in response to first and second complementary duty ratio signals. A duty ratio maintaining circuit is constructed by third and fourth nodes for receiving and maintaining voltages at the first and second nodes, respectively. A first switch is connected between the first and third nodes, and a second switch is connected between the second and fourth nodes. The load current supplying circuit is controlled by voltages at the third and fourth nodes. As a result, even after the first and second switches are turned OFF, the operation of the load current supplying circuit is always sufficient due to the voltages at the third and fourth nodes.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art duty ratio correcting apparatus will be explained with reference to FIGS. 1, 2, 3A and 3B.

Figure 1:
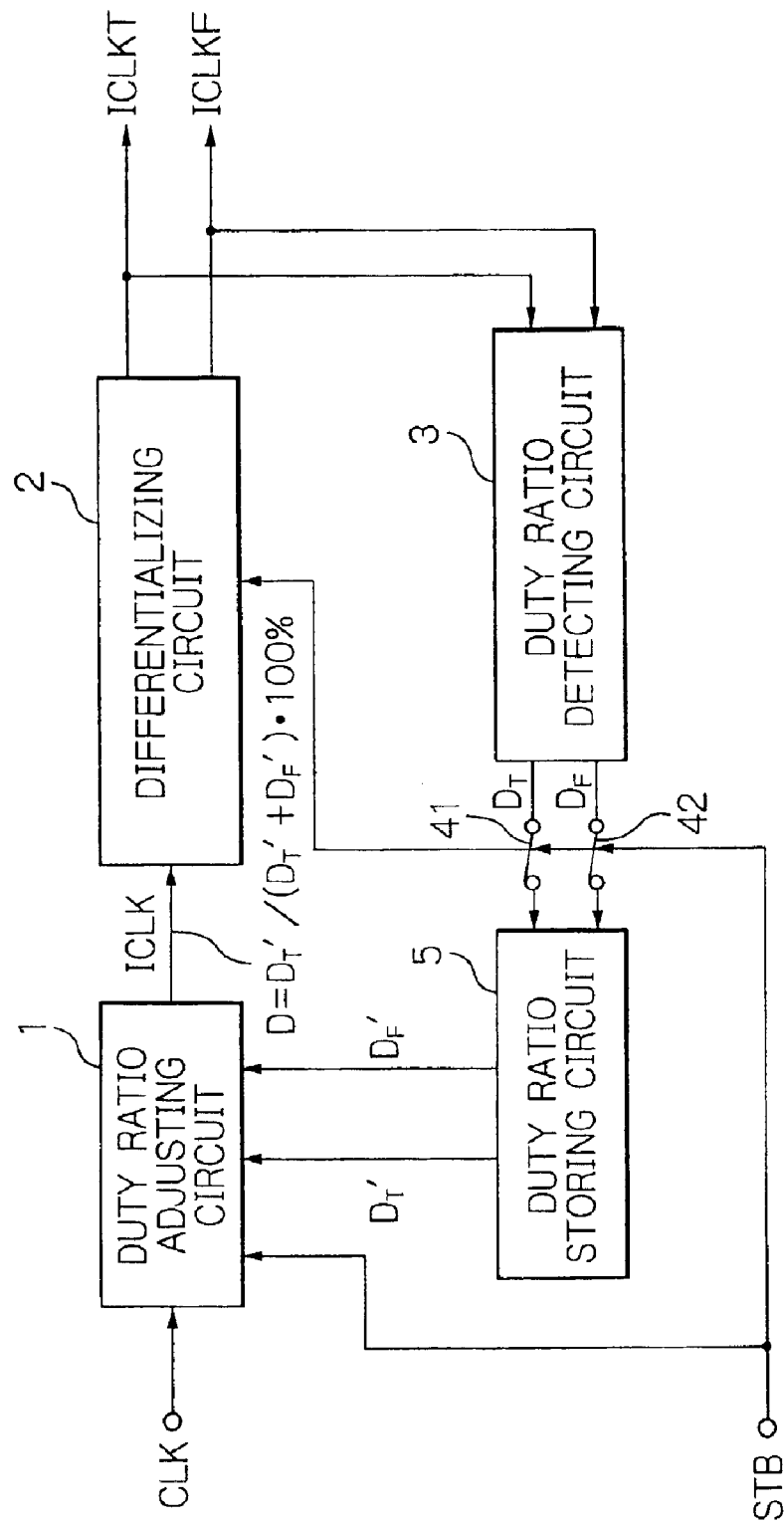
FIG. 1 is a block circuit diagram illustrating a prior art duty ratio correcting apparatus.

In FIG. 1, which illustrates a prior art duty ratio correcting apparatus (see: JP-A-2002-135105), a duty ratio adjusting circuit 1 receives an external clock signal CLK and outputs an internal clock signal ICLK.

The internal clock signal ICLK is supplied to a differentializing circuit 2 which generates two complementary clock signals ICLKT and ICLKF in accordance with the internal clock signal ICLK and transmits the complementary clock signals ICLKT and ICLKF to an internal circuit (not shown).

Also, the complementary clock signals ICLKT and ICLKF are supplied to a duty ratio detecting circuit 3 for detecting a duty ratio $D_T$ of the internal clock signal ICLKT and a duty ratio $D_F$ of the internal clock signal ICLKF.

Note that the duty ratio $D_T$ of the internal clock signal ICLKT is defined by $$D_T = T_{1H}/(T_{1H}+T_{1L}) \times 100\%$$

where $T_{1H}$ is a time period of a high level of the clock signal ICLKT; and $T_{1L}$ is a time period of a low level of the clock signal ICLKT.

Also, the duty ratio $D_F$ of the internal clock signal ICLKF is defined by $$D_F = T_{2H}/(T_{2H}+T_{2L}) \times 100\%$$

where $T_{2H}$ is a time period of a high level of the clock signal ICLKF; and $T_{2L}$ is a time period of a low level of the clock signal ICLKF.

The duty ratios $D_T$ and $D_F$ of the clock signals ICLKT and ICLKF detected by the duty ratio detecting circuit 3 are supplied via switches 41 and 42 to a duty ratio maintaining circuit 5 for storing the duty ratios $D_T$ and $D_F$. Note that each of the switches 41 and 42 is constructed by a transfer gate.

The duty ratio D of the internal clock signal ICLK is defined by $$D = D_{T0}'/(D_{T0}'+D_{F0}') \cdot 100\%$$

The duty ratio D of the internal clock signal ICLK is substantially fed back to the duty ratio adjusting circuit 1. Therefore, the duty ratio adjusting circuit 1 can adjust the duty ratio of the external clock signal CLK in accordance with the duty ratios $D_T'$ and $D_F'$ maintained in the duty ratio maintaining circuit 5, so that the duty ratio D of the internal clock signal ICLK is brought close to a desired ratio such as 50% where $D_T' = D_F'$.

In the duty ratio correcting apparatus of FIG. 1, in order to reduce the power consumption in a stand-by mode, a stand-by signal STB is supplied to the duty adjusting circuit 1 and the differentializing circuit 2, so that the duty ratio adjusting circuit 1 and the differentializing circuit 2 are deactivated. Simultaneously, the switches 41 and 42 are opened so that the duty ratios $D_T'$ and $D_F'$ are maintained in the duty ratio maintaining circuit 5 even in a stand-by mode.

Figure 2:
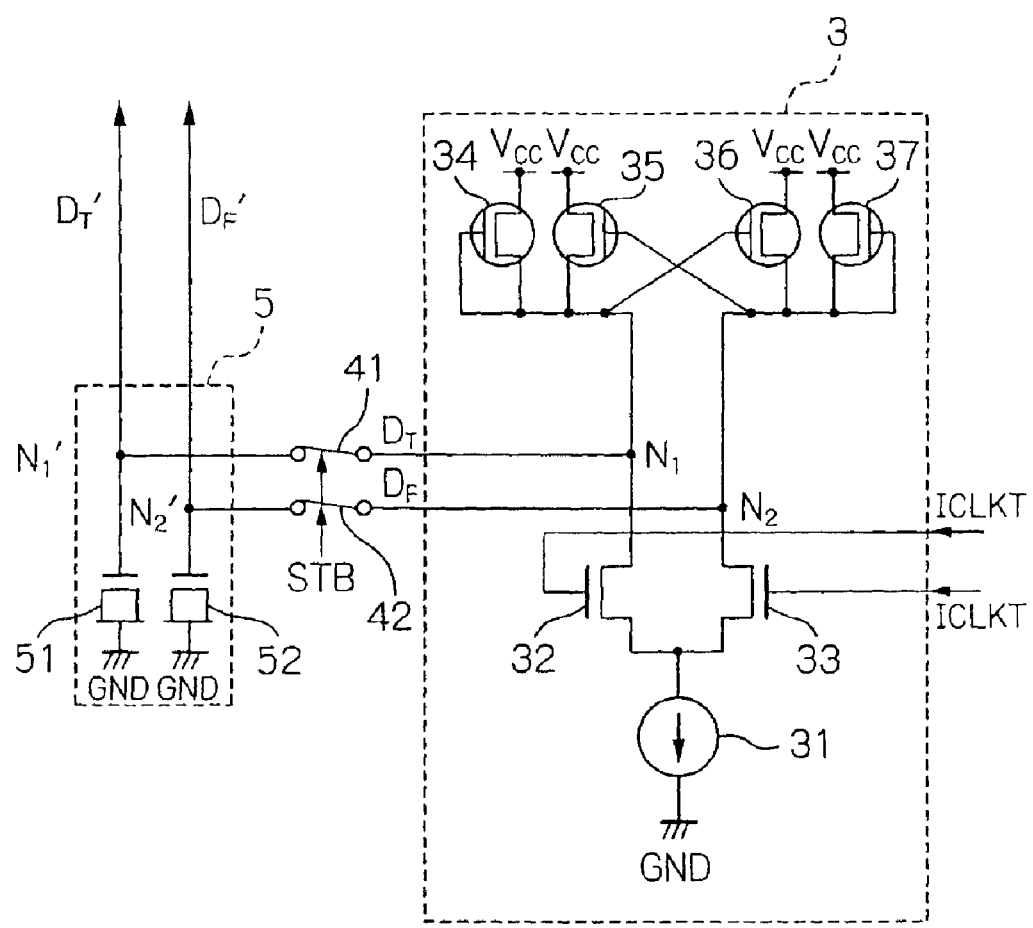
FIG. 2 is a detailed circuit diagram of the duty ratio detecting circuit, the switches and the duty ratio maintaining circuit of FIG. 1.

FIG. 2 is a detailed circuit of the duty ratio detecting circuit 3 and the duty ratio maintaining circuit 5 of FIG. 1.

In FIG. 2, the duty ratio detecting circuit 3 is constructed by a constant current source 31 connected to a ground terminal GND, an N-channel MOS transistor 32 connected between a node $N_1$ and the constant current source 31, an N-channel MOS transistor 33 connected between a node $N_2$ and the constant current source 31, load P-channel MOS transistors 34 and 35 connected between a power supply terminal $V_{cc}$ and the node $N_1$, and load P-channel MOS transistors 36 and 37 connected between the power supply terminal $V_{cc}$ and the node $N_2$. In this case, the gates of the N-channel MOS transistors 32 and 33 receive the clock signals ICLKT and ICLKF, respectively, so that the N-channel MOS transistors 32 and 33 along with the constant current source 31 form a current switch. On the other hand, the P-channel MOS transistors 34 and 37 are diode-coupled, while the P-channel MOS transistors 35 and 36 are cross-coupled.

Also, in FIG. 2, the duty ratio maintaining circuit 5 is constructed by a capacitor 51 connected between a node $N_1'$ and the ground terminal GND, and a capacitor 52 connected between a node $N_2'$ and the ground terminal GND.

The node $N_1$ is connected via the switch 41 to the node $N_1'$, and the node $N_2$ is connected via the switch 42 to the node $N_2'$.

The operation of the duty ratio detecting circuit 3, the switches 41 and 42 and the duty ratio maintaining circuit 5 of FIG. 2 is explained next with reference to FIGS. 3A and 3B. In this case, assume that the duty ratio $D_T$ of the clock signal ICLKT is 60% and the duty ratio $D_F$ of the clock signal ICLKF is 40%.

Figure 3A:
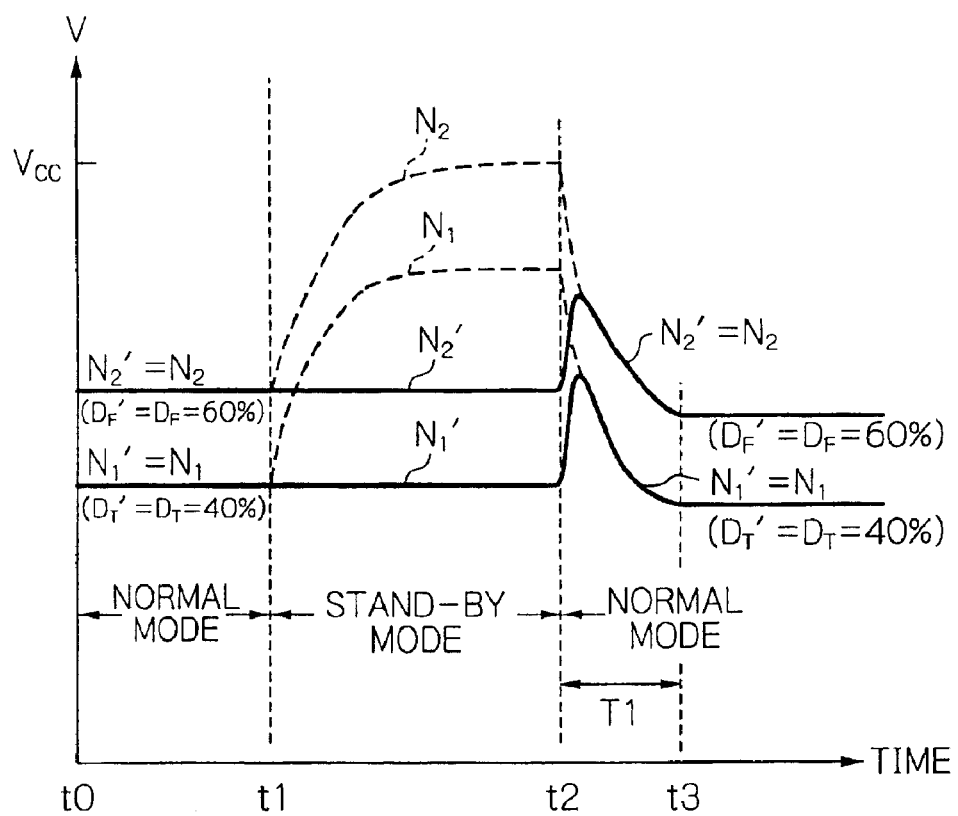
FIGS. 3A and 3B are timing diagrams for explaining the operation of the duty ratio detecting circuit, the switches and the duty ratio maintaining circuit of FIG. 2.

FIG. 3A shows a case where the internal clock signal ICLK is high, i.e., the clock signals ICLKT and ICLKF are high and low, respectively, when the operation enters a stand-by mode.

First, at time t0 to time t1, when the operation is in a normal mode, the switches 41 and 42 are turned ON, $N_1' = N_1$ $N_2' = N_2$ where $N_1$, $N_2$, $N_1'$ and $N_2'$, also designate voltages at the nodes $N_1$, $N_2$, $N_1'$ and $N_2'$, respectively, Next, at time t1, when the operation enters a stand-by mode so that the switches 41 and 42 are turned OFF, although the voltages at the nodes $N_1'$ and $N_2'$ remain at the same levels, the voltages at the nodes $N_1$ and $N_2$ are increased by the load transistors 34, 35, 36 and 37. In this case, since the transistor 33 is turned OFF so that the voltage at the node $N_2$, i.e., the gate voltage of the transistor 35 is increased to $V_{cc}$, so that the transistor 35 is turned OFF. Therefore, the voltage at the node $N_1$ is increased up to $V_{cc} - |V_{thp}|$ by the diode-coupled transistor 34 where $V_{thp}$ is a threshold voltage of the P-channel MOS transistor 34.

Next, at time t2, the operation again enters a normal mode, so that the switches 41 and 42 are turned ON. As a result, the voltages at the nodes $N_1'$ and $N_2'$ coincide with the voltages at the nodes $N_1$ and $N_2$, respectively.

Finally, at time t3, the voltages $N_1'(=N_1)$ and $N_2'(=N_2)$ are brought close to corresponding values determined by the duty ratios $D_T$ and $D_F$, respectively.

In FIG. 3A, at time t2 to time T3, since the voltage at the node $N_2$ is always higher than the voltage at the node $N_1$, the voltage at the node $N_2'$ is also always higher than the voltage at the node $N_1'$. This never invites a reverse adjusting operation of the duty ratio adjusting circuit 1. As a result, a return time T1 is relatively small.

Figure 3B:
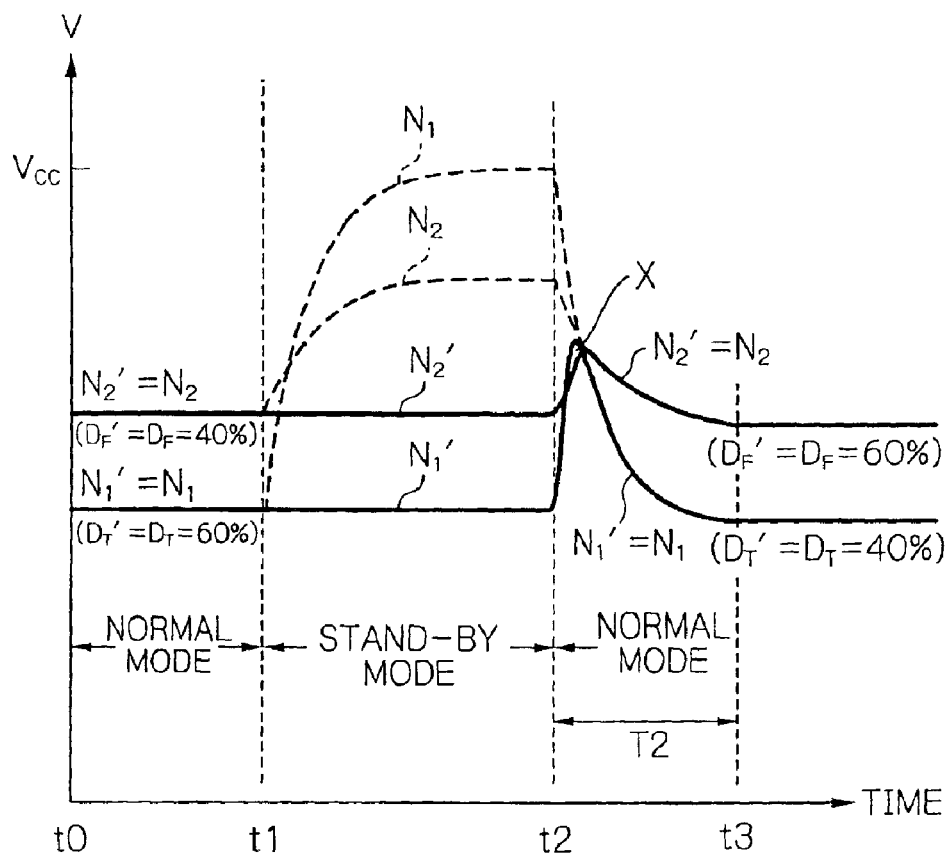

FIG. 3B shows a case where the internal clock signal ICLK is low, i.e., the clock signals ICLKT and ICLKF are low and high, respectively, when the operation enters a stand-by mode.

First, at time t0 to time t1, when the operation is in a normal mode, the switches 41 and 42 are turned ON, $N_1' = N_1$ $N_2' = N_2$ Next, at time t1, when the operation enters a stand-by mode so that the switches 41 and 42 are turned OFF, although the voltages at the nodes $N_1'$ and $N_2'$ remain at the same levels, the voltages at the nodes $N_1$ and $N_2$ are increased by the load transistors 34, 35, 36 and 37. In this case, since the transistor 32 is turned OFF so that the voltage at the node $N_1$, i.e., the gate voltage of the transistor 36 is increased to $V_{cc}$, so that the transistor 36 is turned OFF. Therefore, the voltage at the node $N_2$ is increased up to $V_{cc} - |V_{thp}|$ by the diode-coupled transistor 37 where $V_{thp}$ is a threshold voltage of the P-channel MOS transistor 37.

Next, at time t2, the operation again enters a normal mode, so that the switches 41 and 42 are turned ON. As a result, the voltages at the nodes $N_1'$ and $N_2'$ coincide with the voltages at the nodes $N_1$ and $N_2$, respectively, Finally, at time t3, the voltages $N_1'(=N_1)$ and $N_2'(=N_2)$ are brought close to corresponding values determined by the duty ratios $D_T$ and $D_F$, respectively.

In FIG. 3B, after time t2, when the voltage at the node $N_2$ crosses the voltage at the node $N_1$, the voltage at the node $N_2'$ may be lower than the voltage at the node $N_1'$, as indicated by X in FIG. 3B. This would invite a reverse adjusting operation of the duty ratio adjusting circuit 1. As a result, a return time T2 is relatively large. Thus, the operation of the duty ratio correcting apparatus of FIG. 1 cannot be guaranteed.

Note that, in order to eliminate a voltage reverse portion as indicated by X in FIG. 3B, the gate capacitance of each of the load transistors 34 to 37 can be made smaller while the capacitance of each of the capacitors 51 and 52 can be made larger. In this case, however, it will take a longer time to enter a normal state.

Figure 4:
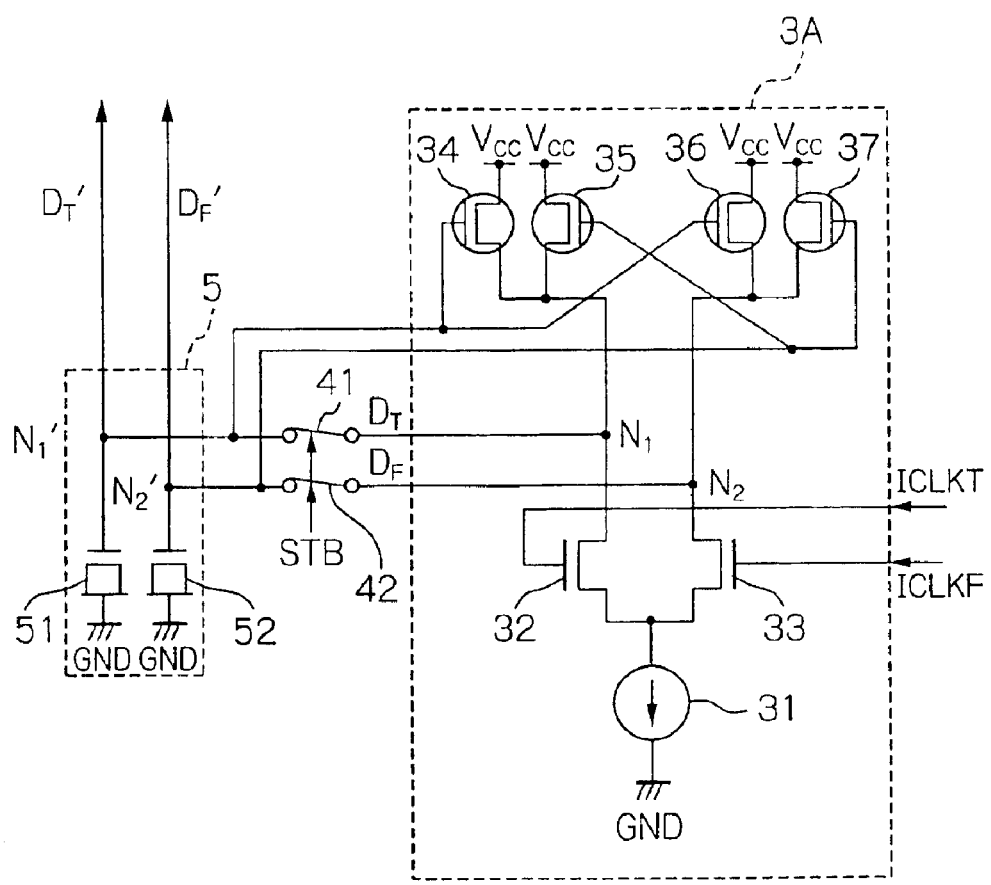
FIG. 4 is a circuit diagram illustrating a first embodiment of the duty ratio detecting apparatus according to the present invention.

In FIG. 4, which illustrates a first embodiment of the duty ratio detecting apparatus according to the present invention, is the duty ratio detecting circuit of FIG. 2 is replaced by a duty ratio detecting apparatus 3A. The duty ratio detecting circuit 3A is the same as the duty ratio detecting circuit 3 of FIG. 2 except that the gates of the transistors 34 and 36 are connected to the node $N_1$' and the gates of the transistors 35 and 37 are connected to the node $N_2$'. As a result, all the load transistors 34, 35, 36 and 37 are always in an ON state even after the switches 41 and 42 are turned OFF.

The operation of the duty ratio detecting circuit 3A, the switches 41 and 42 and the duty ratio maintaining circuit 5 of FIG. 4 is explained next with reference to FIG. 5. In this case, assume that the duty ratio $D_T$ of the clock signal ICLKT is 60% and the duty ratio $D_F$ of the clock signal ICLKF is 40%.

Figure 5:
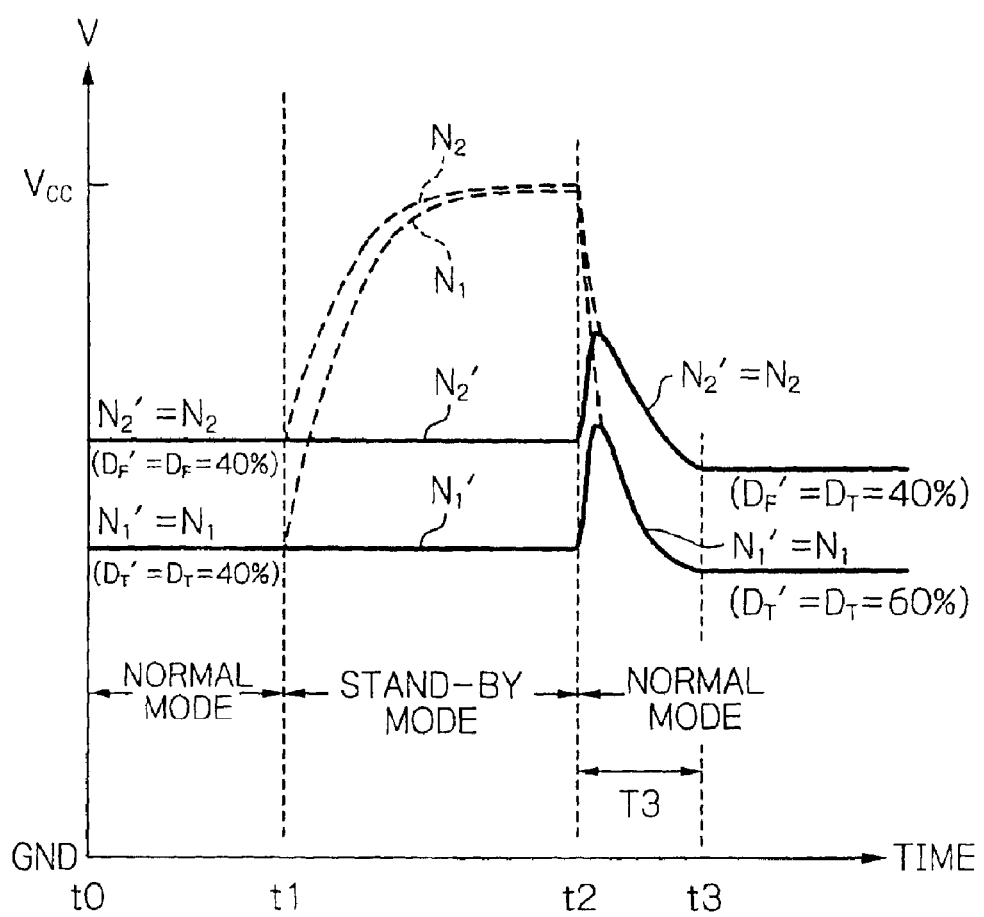
FIG. 5 is a timing diagram for explaining the operation of the duty ratio detecting circuit, the switches and the duty ratio maintaining circuit of FIG. 4.

FIG. 5 shows a case where the internal clock signal ICLK is high, i.e., the clock signals ICLKT and ICLKF are high and low, respectively, when the operation enters a stand-by mode.

First, at time t0 to time t1, when the operation is in a normal mode, the switches 41 and 42 are turned ON, $N_1'=N_1$
$N_2'=N_2$ Next, at time t1, when the operation enters a stand-by mode so that the switches 41 and 42 are turned OFF, although the voltages at the nodes $N_1$' and $N_2$' remain at the same levels, the voltages at the nodes $N_1$ and $N_2$ are increased by the load transistors 34, 35, 36 and 37 to $V_{cc}$. In this case, even when the transistor 33 is turned OFF, the transistor 35 is turned ON by the voltage at the node $N_2$'. Therefore, the voltage at the node $N_1$ is increased up to $V_{cc}$.

Next, at time t2, the operation again enters a normal mode, so that the switches 41 and 42 are turned ON. As a result, the voltages at the nodes $N_1$' and $N_2$' coincide with the voltages at the nodes $N_1$ and $N_2$, respectively.

Finally, at time t3, the voltages $N_1'(=N_1)$ and $N_2'(=N_2)$ are brought close to corresponding values determined by the duty ratios $D_T$ and $D_F$, respectively.

In FIG. 5, at time t2 to time T3, since the voltage at the node $N_2$ is always higher than or equal to the voltage at the node $N_1$, the voltage at the node $N_2$' is also always higher than or equal to the voltage at the node $N_1$'. This never invites a reverse adjusting operation of the duty ratio adjusting circuit 1. Thus, the voltage reversing portion as indicated by X in FIG. 3B is never generated. As a result, a return time T3 is relatively small. Thus, the operation of the duty ratio correcting apparatus of FIG. 1 can be guaranteed.

Note that even when the internal clock signal ICLK is low at a timing when the operation enters a stand-by mode, the operation is similar to that as illustrated in FIG. 5, since the load transistors 34, 35, 36 and 37 are always turned ON during a stand-by mode regardless of the state of the clock signals ICLKT and ICLKF.

Figure 6:
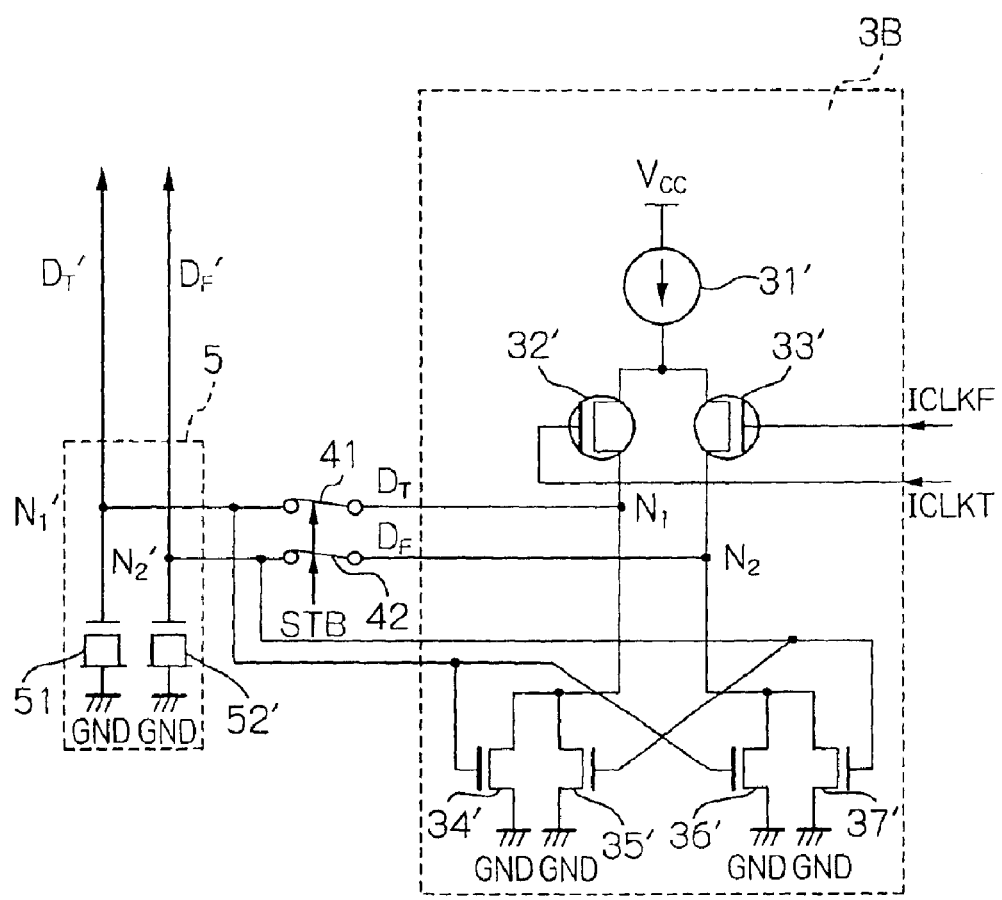
FIG. 6 is a circuit diagram illustrating a second embodiment of the duty ratio detecting apparatus, according to the present invention.

In FIG. 6 which illustrates a second embodiment of the duty ratio correcting apparatus according to the present invention, the duty ratio detecting circuit 3A of FIG. 4 is replaced by a duty ratio detecting circuit 3B where the constant current source 31, the N-channel MOS transistors 32 and 33, and the P-channel MOS transistors 34, 35, 36 and 37 of FIG. 4 are replaced by a constant current source 31', P-channel MOS transistors 32' and 33' and N-channel MOS transistors 34', 35', 36' and 37', respectively. Even in FIG. 6, the gates of the transistors 34' and 36' are connected to the node $N_1$' and the gates of the transistors 35' and 37' are connected to the node $N_2$'. As a result, all the load transistors 34', 35', 36' and 37' are always in an ON state even after the switches 41' and 42' are turned OFF.

The operation of the duty ratio detecting circuit 3B, the switches 41 and 42 and the duty ratio maintaining circuit 5 of FIG. 6 is explained next with reference to FIG. 7. In this case, assume that the duty ratio $D_T$ of the clock signal ICLKT is 60% and the duty ratio $D_F$ of the clock signal ICLKF is 40%.

Figure 7:
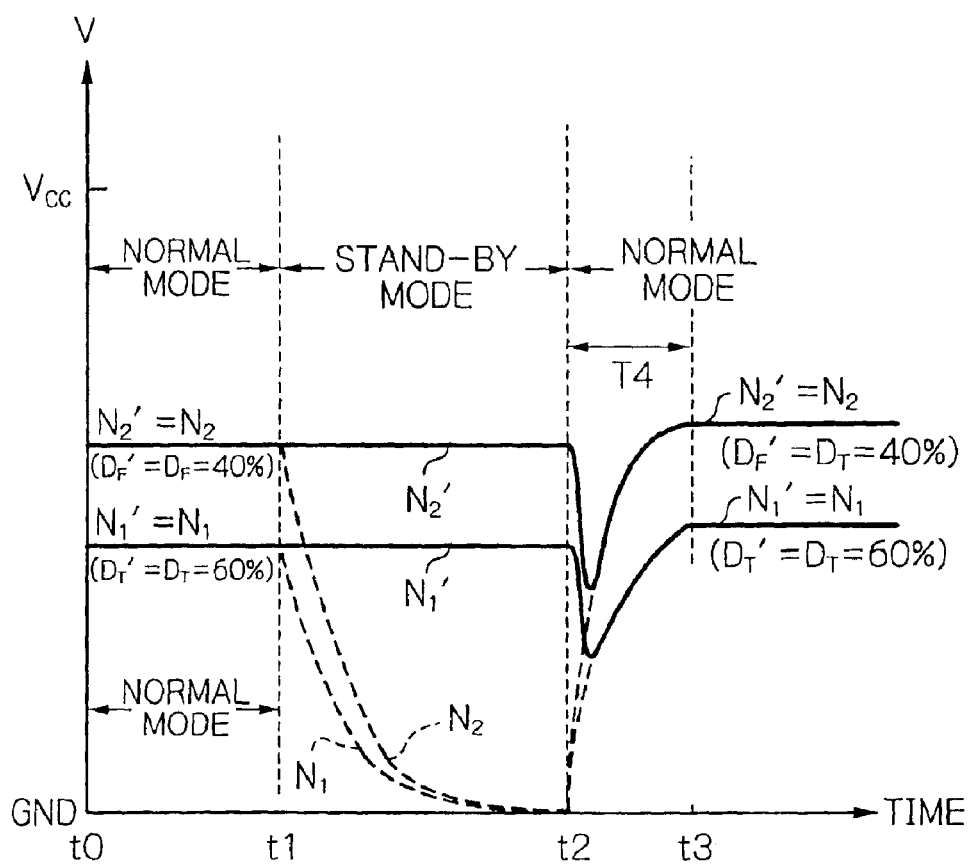
FIG. 7 is a timing diagram for explaining the operation of the duty ratio detecting circuit, the switches and the duty ratio maintaining circuit of FIG. 6.

FIG. 7 shows a case where the internal clock signal ICLK is high, i.e., the clock signals ICLKT and ICLKF are high and low, respectively, when the operation enters a stand-by mode.

First, at time t0 to time t1, when the operation is in a normal mode, the switches 41 and 42 are turned ON, $N_1'=N_1$
$N_2'=N_2$ Next, at time t1, when the operation enters a stand-by mode so that the switches 41 and 42 are turned OFF, although the voltages at the nodes $N_1$' and $N_2$' remain at the same levels, the voltages at the nodes $N_1$ and $N_2$ are decreased by the load transistors 34', 35', 36' and 37' to GND. In this case, even when the transistor 32' is turned OFF, the transistor 35' is turned ON by the voltage at the node $N_1$'. Therefore, the voltage at the node $N_2$ is decreased down to GND.

Next, at time t2, the operation again enters a normal mode, so that the switches 41 and 42 are turned ON. As a result, the voltages at the nodes $N_1$' and $N_2$' coincide with the voltages at the nodes $N_1$ and $N_2$, respectively.

Finally, at time t3, the voltages $N_1'(=N_1)$ and $N_2'(=N_2)$ are brought close to corresponding values determined by the duty ratios $D_T$ and $D_F$, respectively.

In FIG. 7, at time t2 to time t3, since the voltage at the node $N_2$ is always higher than or equal to the voltage at the node $N_1$, the voltage at the node $N_2$' is also always higher than or equal to the voltage at the node $N_1$'. This never invites a reverse adjusting operation of the duty ratio adjusting circuit 1. Thus, the voltage reversing portion as indicated by X in FIG. 3B is never generated. As a result, a return time T4 is relatively small. Thus, the operation of the duty ratio correcting apparatus of FIG. 1 can be guaranteed.

Note that even when the internal clock signal ICLK is low at a timing when the operation enters a stand-by mode, the operation is similar to that as illustrated in FIG. 7, since the load transistors 34', 35', 36' and 37' are always turned ON during a stand-by mode regardless of the state of the clock signals ICLKT and ICLKF.

As explained hereinabove, according to the present invention, since a voltage reversing portion is never generated, the return time can be small and the operation of the duty ratio correcting apparatus can be guaranteed.

What is claimed is:

1. A duty ratio detecting apparatus comprising:

a duty ratio detecting circuit including first and second nodes, a load current supplying circuit for supplying first and second load currents to said first and second nodes, respectively, and a current switch connected to said first and second nodes, said current switch operating in response to first and second complementary duty ratio signals;

a duty ratio maintaining circuit including third and fourth nodes for receiving and maintaining voltages at said first and second nodes, respectively;

a first switch connected between said first and third nodes; and a second switch connected between said second and fourth nodes, said load current supplying circuit being controlled by voltages at said third and fourth nodes.

2. The duty ratio detecting apparatus as set forth in claim 1, wherein said load current supplying circuit comprises:

a first P-channel MOS transistor connected between a first power supply terminal and said first node and having a gate connected to said third node;

a second P-channel MOS transistor connected between said first power supply terminal and said first node and having a gate connected to said fourth node;

a third P-channel MOS transistor connected between said first power supply terminal and said first node and having a gate connected to said third node; and a fourth P-channel MOS transistor connected between said first power supply terminal and said first node and having a gate connected to said fourth node, said current switch comprising:

a constant current source connected to a second power supply terminal;

a first N-channel MOS transistor connected between said first node and said constant current source and having a gate for receiving said first complementary duty ratio signal; and a second N-channel MOS transistor connected between said second node and said constant current source and having a gate for receiving said second complementary duty ratio signal.

3. The duty ratio detecting apparatus as set forth in claim 1, wherein said load current supplying circuit comprises:

a first N-channel MOS transistor connected between a first power supply terminal and said first node and having a gate connected to said third node;

a second N-channel MOS transistor connected between said first power supply terminal and said first node and having a gate connected to said fourth node;

a third N-channel MOS transistor connected between said first power supply terminal and said first node and having a gate connected to said third node; and a fourth N-channel MOS transistor connected between said first power supply terminal and said first node and having a gate connected to said fourth node, said current switch comprising:

a constant current source connected to a second power supply terminal;

a first P-channel MOS transistor connected between said first node and said constant current source and having a gate for receiving said first complementary duty ratio signal; and a second P-channel MOS transistor connected between said second node and said constant current source and having a gate for receiving said second complementary duty ratio signal.

4. The duty ratio detecting apparatus as set forth in claim 1, wherein said duty ratio maintaining circuit comprises first and second capacitors connected to said third and fourth nodes, respectively.

5. A duty ratio correcting apparatus for receiving and correcting an external clock signal, comprising:

a duty ratio adjusting circuit for receiving said external clock signal and adjusting a duty ratio of said external clock signal to generate an internal clock signal;

a differentializing circuit, connected to said duty ratio adjusting circuit, for differentializing said internal clock signal to generate first and second complementary duty ratio signals;

a duty ratio detecting circuit, connected to said differentializing circuit, for detecting first and second duty ratios of said first and second complementary duty ratio signals;

a switch circuit connected to said duty ratio detecting circuit; and a duty ratio maintaining circuit, connected between said switch circuit and said duty ratio adjusting circuit, for maintaining said first and second duty ratios via said switch circuit as third and fourth duty ratios, respectively, so that said duty ratio adjusting circuit adjusts the duty ratio of said external clock signal in accordance with said third and fourth duty ratios, said duty ratio adjusting circuit and said differentializing circuit being deactivated by receiving a stand-by signal, said switch being opened by receiving said stand-by signal, said duty ratio detecting circuit comprising:

first and second nodes;

a load current supplying circuit for supplying first and second load currents to said first and second nodes, respectively; and a current switch connected to said first and second nodes, said current switch operating in response to first and second complementary duty ratio signals, said duty ratio maintaining circuit comprising third and fourth nodes for receiving and maintaining said first and second duty ratios at said first and second nodes, respectively, said switch circuit comprising:

a first switch connected between said first and third nodes; and a second switch connected between said second and fourth nodes, said load current supplying circuit being controlled by said third and fourth duty ratios at said third and fourth nodes, respectively.

6. The duty ratio correcting apparatus as set forth in claim 5, wherein said load current supplying circuit comprises:

a first P-channel MOS transistor connected between a first power supply terminal and said first node and having a gate connected to said third node;

a second P-channel MOS transistor connected between said first power supply terminal and said first node and having a gate connected to said fourth node;

a third P-channel MOS transistor connected between said first power supply terminal and said first node and having a gate connected to said third node; and a fourth P-channel MOS transistor connected between said first power supply terminal and said first node and having a gate connected to said fourth node, said current switch comprising:

a constant current source connected to a second power supply terminal;

a first N-channel MOS transistor connected between said first node and said constant current source and having a gate for receiving said first complementary duty ratio signal; and a second N-channel MOS transistor connected between said second node and said constant current source and having a gate for receiving said second complementary duty ratio signal.

7. The duty ratio correcting apparatus as set forth in claim 5, wherein said load current supplying circuit comprises:
- a first N-channel MOS transistor connected between a first power supply terminal and said first node and having a gate connected to said third node;
- a second N-channel MOS transistor connected between said first power supply terminal and said first node and having a gate connected to said fourth node;
- a third N-channel MOS transistor connected between said first power supply terminal and said first node and having a gate connected to said third node; and
- a fourth N-channel MOS transistor connected between said first power supply terminal and said first node and having a gate connected to said fourth node, said current switch comprising:
- a constant current source connected to a second power supply terminal;
- a first P-channel MOS transistor connected between said first node and said constant current source and having a gate for receiving said first complementary duty ratio signal; and
- a second P-channel MOS transistor connected between said second node and said constant current source and having a gate for receiving said second complementary duty ratio signal.

8. The duty ratio correcting apparatus as set forth in claim 5, wherein said duty ratio maintaining circuit comprises first and second capacitors connected to said third and fourth nodes, respectively.

* * * * *